(12) United States Patent
Seo et al.

(10) Patent No.: US 12,512,060 B2
(45) Date of Patent: Dec. 30, 2025

(54) DISPLAY DEVICE

(71) Applicant: LG Display Co., Ltd., Seoul (KR)

(72) Inventors: Daeyoung Seo, Seoul (KR); ByungHyun Lee, Paju-si (KR); MinSeok Kim, Seoul (KR); TaeYong Kim, Anyang-si (KR); Sumin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/929,137

(22) Filed: Oct. 28, 2024

(65) Prior Publication Data
US 2025/0209983 A1 Jun. 26, 2025

(30) Foreign Application Priority Data

Dec. 22, 2023 (KR) .................. 10-2023-0189180

(51) Int. Cl.
*G09G 3/3233* (2016.01)
*H10K 59/131* (2023.01)

(52) U.S. Cl.
CPC ... *G09G 3/3233* (2013.01); *G09G 2300/0465* (2013.01); *G09G 2300/0842* (2013.01); *G09G 2310/08* (2013.01); *G09G 2320/0233* (2013.01); *G09G 2330/02* (2013.01); *H10K 59/131* (2023.02)

(58) Field of Classification Search
CPC ......... G09G 3/3233; G09G 2300/0465; G09G 2300/0842; G09G 2310/08; G09G 2320/0233; G09G 2320/02; H10K 59/131
See application file for complete search history.

(56) References Cited

U.S. PATENT DOCUMENTS 11,308,864 B1 * 4/2022 Liao .................. G09G 3/32

FOREIGN PATENT DOCUMENTS

KR 10-2018-0057285 A 5/2018

\* cited by examiner

*Primary Examiner* — Robert J Michaud
(74) *Attorney, Agent, or Firm* — Fenwick & West LLP

(57) ABSTRACT

A display device includes a display panel which includes a plurality of sub pixels; a first wiring line which transmits a first power voltage or a turn-off voltage to each of the plurality of sub pixels; a second wiring line which transmits a second power voltage or a reference voltage to each of the plurality of sub pixels; a third wiring line which transmits a data voltage or a sensing voltage to each of the plurality of sub pixels; a plurality of light emitting diodes which is connected to the first wiring line; a first transistor which is connected to the second wiring line; a second transistor which is connected to the second wiring line; and a third transistor which is connected to the third wiring line.

15 Claims, 7 Drawing Sheets

DISPLAY DEVICE

CROSS-REFERENCE TO RELATED APPLICATION

This application claims the priority of Republic of Korea Patent Application No. 10-2023-0189180 filed on Dec. 22, 2023, which is hereby incorporated by reference in its entirety.

BACKGROUND

Field

The present disclosure relates to a display device, and more particularly to a display device including a sub pixel in which external compensation is possible.

Description of the Related Art

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

In the meantime, various types of display elements may be used for the display device and a circuit for driving the display elements, such as a driving transistor or a capacitor may be used together. However, there may be a characteristic deviation of the driving transistor disposed in each of the plurality of sub pixels and the luminance is not uniform between the sub pixels due to the characteristic deviation. Therefore, in order to improve the luminance uniformity, a compensating method, such as an external compensating method which compensates for the characteristic deviation by directly sensing the threshold voltage of the driving transistor is used.

SUMMARY

An object to be achieved by the present disclosure is to provide a display device in which various signal lines are combined as one wiring line.

Another object to be achieved by the present disclosure is to provide a display device which is capable of reducing the number of wiring lines to drive the sub pixel.

Still another object to be achieved by the present disclosure is to provide a display device with an improved aperture ratio.

Still another object to be achieved by the present disclosure is to provide a display device with an improved transmittance.

Still another object to be achieved by the present disclosure is to provide a display device which reduces a manufacturing cost by reducing the number of wiring lines.

Still another object to be achieved by the present disclosure is to provide a display device which simultaneously senses threshold voltages of driving transistors of a plurality of sub pixels.

Still another object to be achieved by the present disclosure is to provide a display device in which a voltage applied to a wiring line varies to be driven separately for a data writing period, an emission period, and a sensing period.

Objects of the present disclosure are not limited to the above-mentioned objects, and other objects, which are not mentioned above, can be clearly understood by those skilled in the art from the following descriptions.

In order to achieve the objects as described above, according to an aspect of the present disclosure, a display device includes a display panel which includes a plurality of sub pixels; a first wiring line which transmits a first power voltage or a turn-off voltage to each of the plurality of sub pixels; a second wiring line which transmits a second power voltage or a reference voltage to each of the plurality of sub pixels; a third wiring line which transmits a data voltage or a sensing voltage to each of the plurality of sub pixels; a plurality of light emitting diodes which is disposed in each of the plurality of sub pixels and is connected to the first wiring line; a first transistor which is disposed in each of the plurality of sub pixels and is connected to the second wiring line; a second transistor which is disposed in each of the plurality of sub pixels and is connected to the second wiring line; and a third transistor which is disposed in each of the plurality of sub pixels and is connected to the third wiring line, and the plurality of light emitting diodes includes a main light emitting diode and a redundancy light emitting diode. Accordingly, signal lines such as a data line, a power line, and a reference line are combined to first to third wiring lines to reduce the number of total wiring lines of the display device.

Other detailed matters of the exemplary embodiments are included in the detailed description and the drawings.

According to the present disclosure, a plurality of signal lines is used to be combined as one wiring line.

According to the present disclosure, the number of wiring lines for driving sub pixels may be reduced.

According to the present disclosure, the number of wiring lines is reduced to improve an aperture ratio and a transmittance of the display device.

According to the present disclosure, the number of wiring lines is reduced to save the manufacturing cost.

According to the present disclosure, threshold voltages of driving transistors of the plurality of sub pixels are simultaneously sensed to reduce a total sensing time.

According to the present disclosure, an external compensation method which directly senses and compensates for a threshold voltage of a driving transistor is used to reduce a luminance deviation between the plurality of sub pixels.

According to the present disclosure, a voltage which is applied to a wiring line varies to drive the sub pixel separately for the data writing period, the emission period, and the sensing period.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
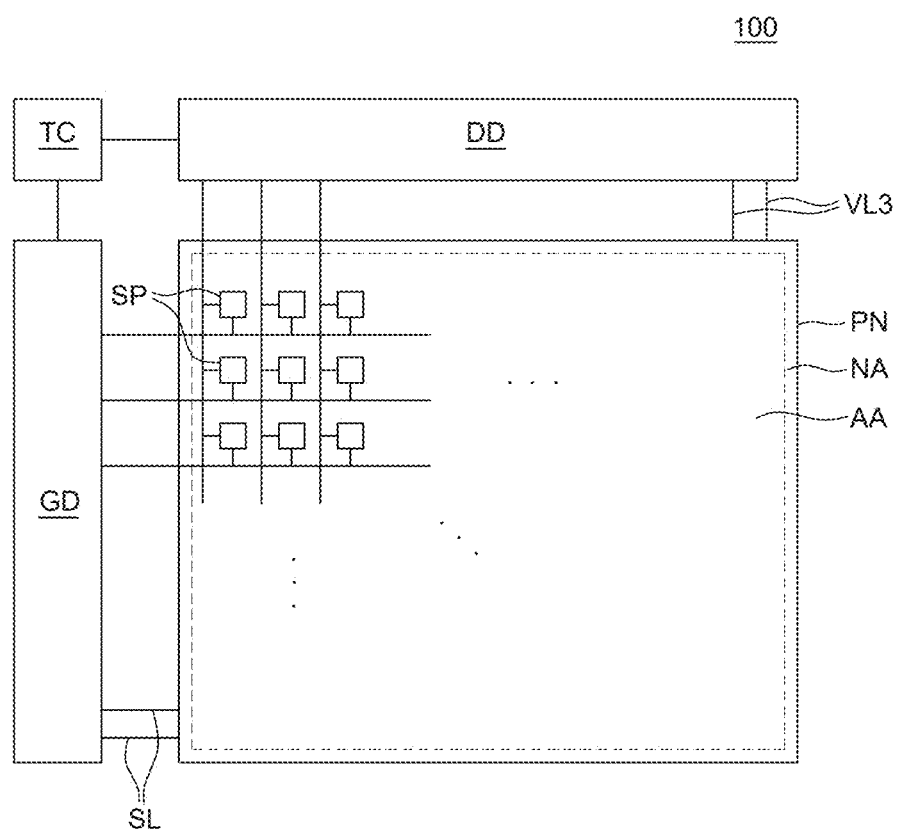
FIG. 1 is a schematic diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a schematic diagram of a display device according to an exemplary embodiment of the present disclosure. In FIG. 1, for the convenience of description, among various components of the display device 100, a display panel PN, a gate driver GD, a data driver DD, and a timing controller TC are illustrated.

Referring to FIG. 1, the display device 100 includes the display panel PN including a plurality of sub pixels SP, the gate driver GD and the data driver DD which supply various signals to the display panel PN, and the timing controller TC which controls the gate driver GD and the data driver DD.

The gate driver GD supplies a plurality of scan signals SCAN to a plurality of scan lines SL according to a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD supplies a data voltage Vdata to a plurality of third wiring lines VL3 functioning as a data line according to a plurality of data control signals and image data supplied from the timing controller TC. The data driver DD converts the image data into a data voltage Vdata using a reference gamma voltage and may supply the converted data voltage Vdata to the plurality of third wiring lines VL3.

The timing controller TC aligns image data input from the outside to supply the image data to the data driver DD. The timing controller TC may generate a gate control signal and a data control signal using synchronization signals input from the outside, such as a dot clock signal, a data enable signal, and horizontal/vertical synchronization signals. Further, the timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of third wiring lines VL3 intersect each other and the plurality of sub pixels SP may be formed at intersections of the scan lines SL and the third wiring line VL3.

In the display panel PN, an active area AA and a non-active area NA may be defined.

The active area AA is an area in which images are displayed in the display device 100. In the active area AA, a plurality of sub pixels SP which configures a plurality of pixels and a pixel circuit for driving the plurality of sub pixels SP may be disposed. A sub pixel SP is a minimum unit which configures the active area AA and n sub pixels SP form one pixel. In each of the plurality of sub pixels SP, a thin film transistor for driving the plurality of light emitting diodes EL may be disposed. The plurality of light emitting elements EL may be defined in different ways depending on the type of the display panel PN. For example, when the display panel PN is an inorganic light emitting display panel PN, the light emitting diode EL may be a light emitting diode (LED) or a micro light emitting diode (micro-LED).

In the active area AA, a plurality of signal lines which transmit various signals to the plurality of sub pixels SP are disposed. For example, the plurality of signal lines include a plurality of third wiring lines VL3 which supplies a data voltage Vdata to each of the plurality of sub pixels SP and a plurality of scan lines SL which supply a scan signal SCAN to each of the plurality of sub pixels SP. The plurality of scan lines SL extend in one direction in the active area AA to be connected to the plurality of sub pixels SP and the plurality of third wiring lines VL3 extend in a direction different from the one direction in the active area AA to be connected to the plurality of sub pixels SP. In addition, in the active area AA, a low potential power line and a high potential power line may be further disposed, but are not limited thereto.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving IC, such as a gate driver IC or a data driver IC, may be disposed.

In the meantime, the non-active area NA may be located on a rear surface of the display panel PN, that is, a surface on which the sub pixels SP are not disposed or may be omitted, and is not limited as illustrated in the drawing.

In the meantime, a driver, such as the gate driver GD, the data driver DD, and the timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner.

For example, the data driver DD and the timing controller TC are formed in separate flexible film and printed circuit board. The display panel PN is electrically connected to the data driver DD and the timing controller TC by bonding the flexible film and the printed circuit board to the pad electrode formed in the non-active area NA of the display panel PN.

As another example, the gate driver GD is mounted in the active area AA in the GIA manner and a side line which connects the signal line on the front surface of the display panel PN to the pad electrode on a rear surface of the display panel PN is formed to bond the flexible film and the printed circuit board onto a rear surface of the display panel PN. At this time, the non-active area NA may be minimized on the front surface of the display panel PN. Therefore, when the gate driver GD, the data driver DD, and the timing controller TC are connected to the display panel PN as described above, a zero bezel with substantially no bezel may be implemented.

Hereinafter, the plurality of sub pixels SP will be described in more detail with reference to FIG. 2.

Figure 2:
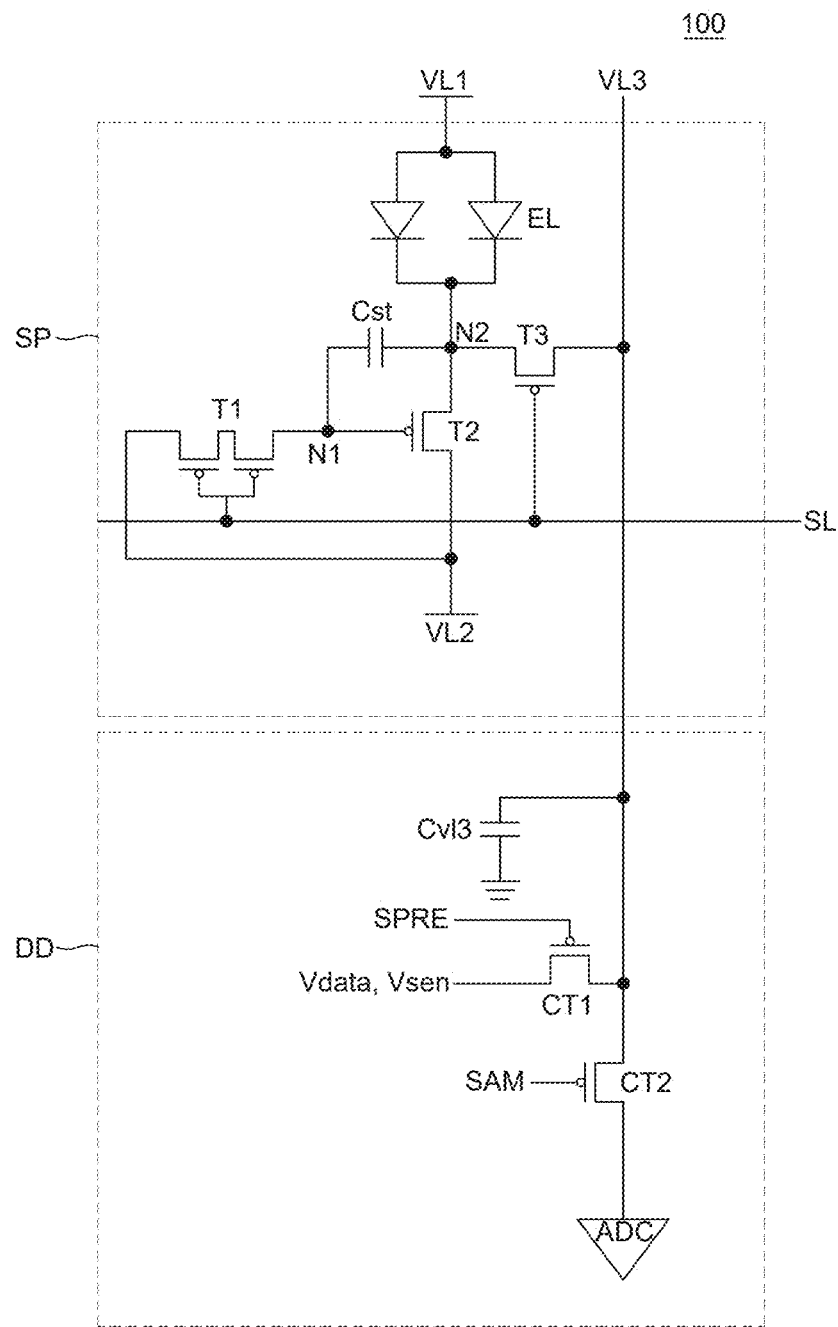
FIG. 2 is a circuit diagram of a sub pixel and a data driver of a display device according to an exemplary embodiment of the present disclosure.

FIG. 2 is a circuit diagram of a sub pixel and a data driver of a display device according to an exemplary embodiment of the present disclosure. Referring to FIG. 2, a sub pixel SP of the display device 100 according to the exemplary embodiment of the present disclosure includes one or more light emitting diodes EL, a first transistor T1, a second transistor T2, a third transistor T3, and a capacitor Cst. The data driver DD includes an analog-digital converter ADC, a first control transistor CT1, a second control transistor CT2, and a line capacitor Cvl3.

Referring to FIG. 2, a plurality of transistors are disposed in each of the plurality of sub pixels SP. The plurality of transistors may be N-type transistors or P-type transistors. In the N-type transistor, carriers are electrons so that electrons flow from the source electrode to the drain electrode and currents flow from the drain electrode to the source electrode. In the P-type transistor, carriers are holes so that holes flow from the source electrode to the drain electrode and currents flow from the source electrode to the drain electrode. For example, one of the plurality of transistors may be an N-type transistor and the other one of the plurality of transistors may be a P-type transistor.

Hereinafter, it is assumed that the plurality of transistors are P-type transistors, but is not limited thereto.

First, each of the plurality of sub pixels SP includes one or more light emitting diodes EL, the first transistor T1, the second transistor T2, the third transistor T3, and the capacitor Cst. The sub pixel SP is connected to a scan line SL, a first wiring line VL1, a second wiring line VL2, and a third wiring line VL3.

The first transistor T1 is a transistor for electrically connecting the second wiring line VL2 to a gate electrode of the second transistor T2. The first transistor T1 is a transistor for controlling a voltage of a gate electrode of the second transistor T2. The gate electrode of the first transistor T1 is connected to the scan line SL, the source electrode is connected to the second wiring line VL2. The drain electrode is connected to the first node N1 and the gate electrode of the second transistor T2. The first transistor T1 is turned on by the scan signal SCAN from the scan line SL to electrically connect the second wiring line VL2 and the gate electrode of the second transistor T2.

The second transistor T2 is a transistor which controls a driving current to be supplied to the light emitting diode EL. The gate electrode of the second transistor T2 is connected to the first node N1, the source electrode is connected to the second node N2, and the drain electrode is connected to the second wiring line VL2. An intensity of a driving current which flows to the light emitting diode EL is determined based on a gate-source voltage Vgs of the second transistor T2. Accordingly, the second transistor T2 may be referred to as a driving transistor.

The third transistor T3 is a transistor for electrically connecting the third wiring line VL3 to a source electrode of the second transistor T2. The third transistor T3 is a transistor which transmits a data voltage Vdata to the second transistor T2 or senses a threshold voltage of the second transistor T2. The gate electrode of the third transistor T3 is connected to the scan line SL, the source electrode is connected to the second node N2, and the drain electrode is connected to the third wiring line VL3. The third transistor T3 is turned on by the scan signal SCAN from the scan line SL to electrically connect the third wiring line VL3 and the source electrode of the second transistor T2.

One or more light emitting diodes EL are disposed in the sub pixel SP. As illustrated in the drawings, a plurality of light emitting diodes EL which are connected in parallel may be used and one light emitting diode EL may be used according to the design. The light emitting diode EL is an element which emits light based on a driving current. The light emitting diode EL includes an anode and a cathode. The anode of the light emitting diode EL is connected to the first wiring line VL1 and the cathode is connected to the second node N2 and the source electrode of the second transistor T2. Accordingly, the light emitting diode EL emits light based on a driving current which flows from the first wiring line VL1 to the second transistor T2.

One of various display elements may be used as the light emitting diode EL. For example, the light emitting diode EL may be an organic light emitting diode (OLED) which includes an anode, an organic layer, and a cathode. Further, as the light emitting diode EL, a light emitting diode (LED) or a micro light emitting diode (micro-LED), or a quantum dot light emitting diode (QLED) including quantum dots (QD) may be further used, but it is not limited thereto.

In the meantime, one of the plurality of light emitting diodes EL disposed in one sub pixel SP is used as a main light emitting diode EL and the other light emitting diode EL may be used as a redundancy light emitting diode EL. The redundancy light emitting diode EL may be a light emitting diode EL which is additionally disposed in the sub pixel SP for preparation of a defect of the main light emitting diode EL. Even though a defect occurs in the main light emitting diode EL, the redundancy light emitting diode EL may normally emit light. Accordingly, the redundancy light emitting diode EL is further disposed in the sub pixel SP, the defect of the sub pixel SP caused by the defect of the main light emitting diode EL may be minimized.

The capacitor Cst maintains a potential difference between the gate electrode and the source electrode of the second transistor T2 while the light emitting diode EL emits light, so that a constant driving current may be supplied to the light emitting diode EL. As described above, the driving current may be determined according to the gate-source voltage Vgs of the second transistor T2 and the capacitor Cst may constantly maintain the gate-source voltage Vgs while the light emitting diode EL emits light. The capacitor Cst includes a plurality of capacitor Cst electrodes and some capacitor Cst electrode is connected to the first node N1 and the gate electrode of the second transistor T2 and the other capacitor Cst electrode is connected to the second node N2 and the source electrode of the second transistor T2.

The first wiring line VL1 is a wiring line for supplying a first power voltage or a turn-off voltage VOFF to the sub pixel SP.

The first wiring line VL1 is a wiring line for supplying a turn-on voltage or a turn-off voltage VOFF. The first power voltage which is transmitted from the first wiring line VL1 to the sub pixel SP allows the light emitting diode EL to emit light. The turn-off voltage VOFF which is transmitted from the first wiring line VL1 to the sub pixel SP does not allow the light emitting diode EL to emit light. When the first power voltage is supplied to the sub pixel SP, the driving current flows to the sub pixel SP to turn on the light emitting diode EL and when the turn-off voltage is supplied to the sub pixel SP, the driving current does not flow to the sub pixel SP and the light emitting diode EL may be turned off.

When the light emitting diode EL emits light, a relatively higher level of voltage may be applied to the first wiring line VL1 which is connected to the anode of the light emitting diode so as to flow the driving current from the anode to the cathode side of the light emitting diode EL. Also, a relatively lower level of voltage may be applied to the second wiring line VL2. For example, the first power voltage which is applied to the first wiring line VL1 is a high potential power voltage VDD. The first power voltage which is the high potential power voltage VDD is a voltage which turns on the light emitting diode EL so that it is also referred to as a turn-on voltage. Further, when the light emitting diode EL is not allowed to emit light, a turn-off voltage VOFF which is applied to the first wiring line VL1 is a same level of voltage as a voltage which is applied to the second wiring line VL2, for example, 0 V.

Hereinafter, it is assumed that the first power voltage is a high potential power voltage VDD and the turn-off voltage VOFF is 0 V. However, the first power voltage and the turn-off voltage VOFF may vary depending on a connection position of the first line VL1, but it is not limited thereto.

Accordingly, during a period when the light emitting diode EL of the sub pixel SP emits light, the high potential power voltage VDD which is the first power voltage is output to the first wiring line VL1 and during a period when the light emitting diode EL does not emit light, the turn-off voltage VOFF is output to the first wiring line VL1. The driving current may flow from the first wiring line VL1 to the light emitting diode EL while the high potential power voltage VDD is supplied and the driving current may not flow to the light emitting diode EL while the turn-off voltage VOFF is supplied. Accordingly, the first wiring line VL1 serves as a high potential power line and a wiring line which controls the light emitting diode EL to emit light.

The second wiring line VL2 is a wiring line for supplying a second power voltage or a reference voltage VREF to the sub pixel SP. The second power voltage is output to the second wiring line VL2 while the image is displayed. The reference voltage VREF is output to the second wiring line VL2 during a period when a characteristic of each of the plurality of sub pixels SP, for example, the threshold voltage of the second transistor T2 is sensed. When the display device 100 displays an image, that is, the sub pixel SP is driven, the second power voltage may be applied to the second wiring line VL2. Further, in order to sense the threshold voltage of the second transistor T2 of the plurality of sub pixels SP during the sensing period, the reference voltage VREF may be applied to the second wiring line VL2.

At this time, as described above, a relatively high level of voltage is applied to the first wiring line VL1 and a relatively low level of voltage is applied to the second wiring line VL2 so that the driving current flows to the sub pixel SP. Accordingly, the second power voltage applied to the second wiring line VL2 may be a voltage lower than the first power voltage, for example, a low potential power voltage VSS. Further, during the sensing period, the threshold voltage of the second transistor T2 may be sensed by fixing a voltage of the gate electrode of the second transistor T2 to the reference voltage VREF and sensing a voltage of the source electrode. Therefore, the reference voltage VREF applied to the gate electrode of the second transistor T2 may be set to various voltages. For example, the threshold voltage of the second transistor T2 may be sensed by setting the reference voltage VREF to a voltage of 4.5 V. Accordingly, the second wiring line VL2 may serve as a low potential power line and a reference line.

Hereinafter, it is assumed that the second power voltage is a low potential power voltage VSS and the reference voltage VREF is 4.5V. However, the second power voltage and the reference voltage VREF may vary depending on a connection position of the second wiring line VL2, but it is not limited thereto.

The third wiring line VL3 is a wiring line which supplies a data voltage Vdata or a sensing voltage Vsen to the sub pixel SP or senses a voltage change of the source electrode of the second transistor T2. The data voltage Vdata is output to the third wiring line VL3 while driving the sub pixel SP. Further, during a period when characteristics of the plurality of sub pixels SP are sensed, the sensing voltage Vsen is output to the third wiring line VL3 or a voltage change of the source electrode of the second transistor T2 may be sensed using the third wiring line VL3. When the display device 100 displays an image, the data voltage Vdata may be applied to the third wiring line VL3. When a screen of the display device 100 is turned off, during a partial period of the sensing period when the threshold voltage of the second transistor T2 is sensed, the sensing voltage Vsen is applied to the third wiring line VL3. Further, during the remaining period of the sensing period, the voltage change of the source electrode of the second transistor T2 may be sensed using the third wiring line VL3. As a result, the third wiring line VL3 may serve as a data line and a sensing line.

Next, the data driver DD includes an analog-digital converter ADC, a line capacitor Cvl3, a first control transistor CT1, and a second control transistor CT2.

The first control transistor CT1 is a transistor for applying the data voltage Vdata and the sensing voltage Vsen to the third wiring line VL3. The gate electrode of the first control transistor CT1 is connected to the first control line and the drain electrode is connected to the third wiring line VL3. Further, the source electrode of the first control transistor CT1 may be connected to a configuration of the data driver DD from which the data voltage Vdata and the sensing voltage Vsen are output, for example, a digital-analog converter. The first control transistor CT1 may be turned on by a first control signal SPRE from the first control line and the turned-on first control transistor CT1 may transmit the data voltage Vdata or the sensing voltage Vsen from the data driver DD to the third wiring line VL3.

In the meantime, even though it is not illustrated in the drawing, the digital-analog converter of the data driver DD converts the digital signal into analog data voltage Vdata and sensing voltage Vsen to output the analog data voltage and sensing voltage. The digital-analog converter may output the data voltage Vdata and the sensing voltage Vsen to the third wiring line VL3 through the turned-on first control transistor CT1.

The second control transistor CT2 is a transistor for connecting the analog-digital converter ADC and the third wiring line VL3. The gate electrode of the second control transistor CT2 is connected to the second control line and the source electrode and the drain electrode are connected to the analog-digital converter ADC and the third wiring line VL3. The second control transistor CT2 is turned on by the second control signal SAM from the second control line and the turned-on second control transistor CT2 may connect the analog-digital converter ADC and the third wiring line VL3.

The analog-to-digital converter ADC converts an analog voltage into a digital signal to output the digital signal. The analog-to-digital converter ADC may convert a voltage of the third wiring line VL3 which is a voltage stored in the line capacitor Cvl3 into a digital signal, by means of the turned-on second control transistor CT2.

The line capacitor Cvl3 is a capacitor Cst formed between the third wiring line VL3 and a ground voltage. A voltage of the third wiring line VL3, for example, a voltage of the source electrode of the second transistor T2 connected to the third wiring line VL3 may be charged in the line capacitor Cvl3. When the second control transistor CT2 is turned on to connect the analog-to-digital converter ADC and the third wiring line VL3, the analog-digital converter ADC senses a voltage stored in the line capacitor Cvl3 and may convert the voltage into a digital signal.

In the meantime, the display device 100 according to the exemplary embodiment of the present disclosure may be driven separately in a period when an image is displayed and a sensing period. In a period when an image is displayed, the sub pixel SP may be driven in the order of the data writing period Writing and the emission period Emission. Further, the sensing period Sensing is a period when a characteristic deviation of the sub pixel SP, that is, a threshold voltage deviation of the second transistor T2 is sensed and compensated and may be performed when the power of the display device 100 is turned off. The sensing period may be configured by a real time sensing manner OFF-RS that the characteristic deviation between the plurality of sub pixels SP is sensed when the power of the display device 100 is off. In the sensing period, the threshold voltage of the second transistor T2 of the plurality of sub pixels SP is sensed and then a data voltage Vdata to be applied the sub pixel SP later may be compensated.

Therefore, in the display device 100 according to the exemplary embodiment of the present disclosure, in each of the period when the image is displayed and the sensing period, voltages output to the first wiring line VL1, the second wiring line VL2, and the third wiring line VL3 are different. The first wiring line VL1, the second wiring line VL2, and the third wiring line VL3 are connected to the driver of the display device, for example, a driver including a timing controller TC and a data drive DD, to be applied with voltages. The driver of the display device 100 outputs one of a first power voltage and a turn-off voltage VOFF to the first wiring line VL1, outputs one of a second power voltage and a reference voltage VREF to the second wiring line VL2, and one of a data voltage Vdata and a sensing voltage Vsen to the third wiring line VL3, according to the driving period.

At this time, the first wiring line VL1 and the second wiring line VL2 are wiring lines which perform a function of being applied with a voltage from the driver to transmit the voltage to the sub pixel SP. Therefore, the driver of the display device 100 may vary a voltage to be output to the first wiring line VL1 and the second wiring line VL2 in consideration of a driving state.

However, the third wiring line VL3 serves to be applied with the sensing voltage Vsen and the data voltage Vdata from the data driver VDD to transmit the sensing voltage and the data voltage to the sub pixel SP and also serves as a wiring line for sensing a threshold voltage of the second transistor T2 of the sub pixel SP. Further, the function of outputting the data voltage Vdata and the sensing voltage Vsen from the third wiring line VL3 to the sub pixel SP and the function of detecting the threshold voltage of the second transistor T2 of the sub pixel SP by the third wiring line VL3 may be performed in different periods. Accordingly, the third wiring line VL3 transmits the data voltage Vdata and the sensing voltage Vsen to the sub pixel SP or may transmit a voltage of the sub pixel SP to the data driver DD by the first control transistor CT1 and the second control transistor CT2 of the data driver DD.

For example, in a period when the display device 100 displays an image or a partial period of the sensing period, the digital-to-analog converter of the data driver DD and the third wiring line VL3 are connected to apply the data voltage Vdata and the sensing voltage Vsen to the third wiring line VL3. For example, in another partial period of the sensing period, the analog-digital converter ADC and the third wiring line VL3 are connected and the threshold voltage of the second transistor T2 of the sub pixel SP may be sensed by means of the third wiring line VL3. Therefore, during a partial period, the third wiring line VL3 and the digital-analog converter are connected to apply the sensing voltage Vsen and the data voltage Vdata to the sub pixel SP. During another partial period, the third wiring line VL3 and the analog-digital converter ADC are connected to detect a voltage change of the third wiring line VL3.

Hereinafter, a driving process of the sub pixel SP and a threshold voltage sensing process of a second transistor T2 of the display device 100 according to the exemplary embodiment of the present disclosure will be described in more detail with reference to FIGS. 3A to 4.

Figure 3A:
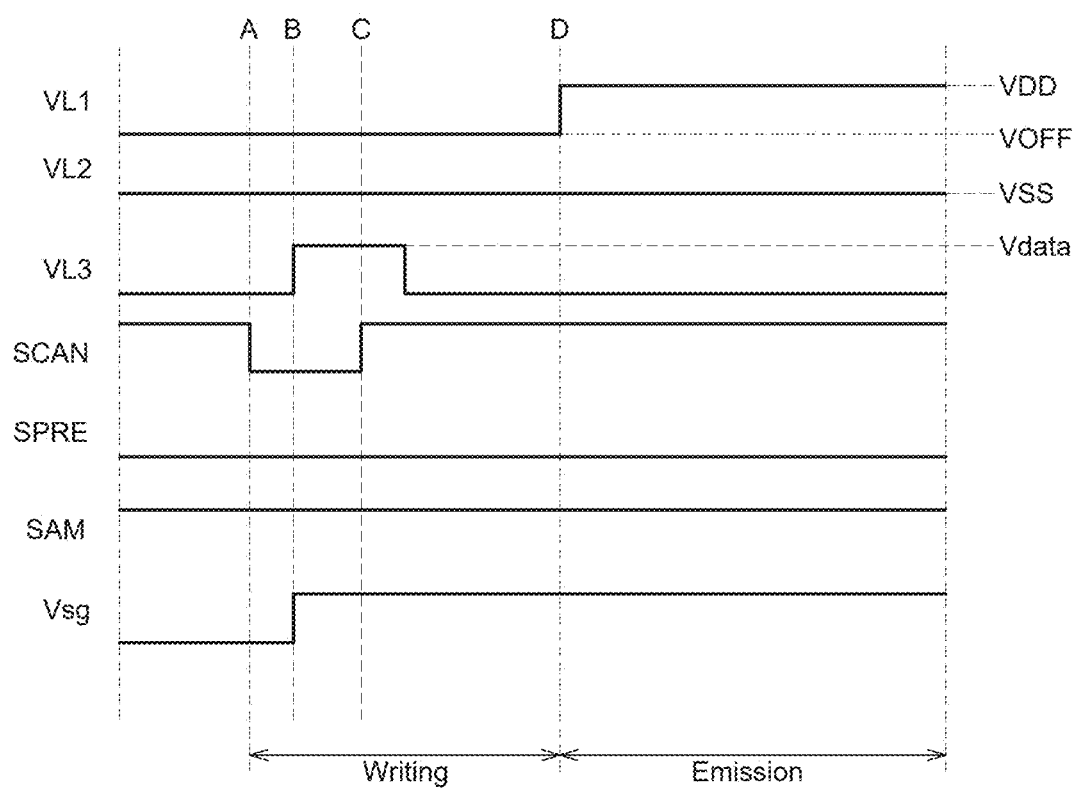
FIGS. 3A and 3B are driving timing diagrams of a sub pixel of a display device according to an exemplary embodiment of the present disclosure.
Figure 3B:
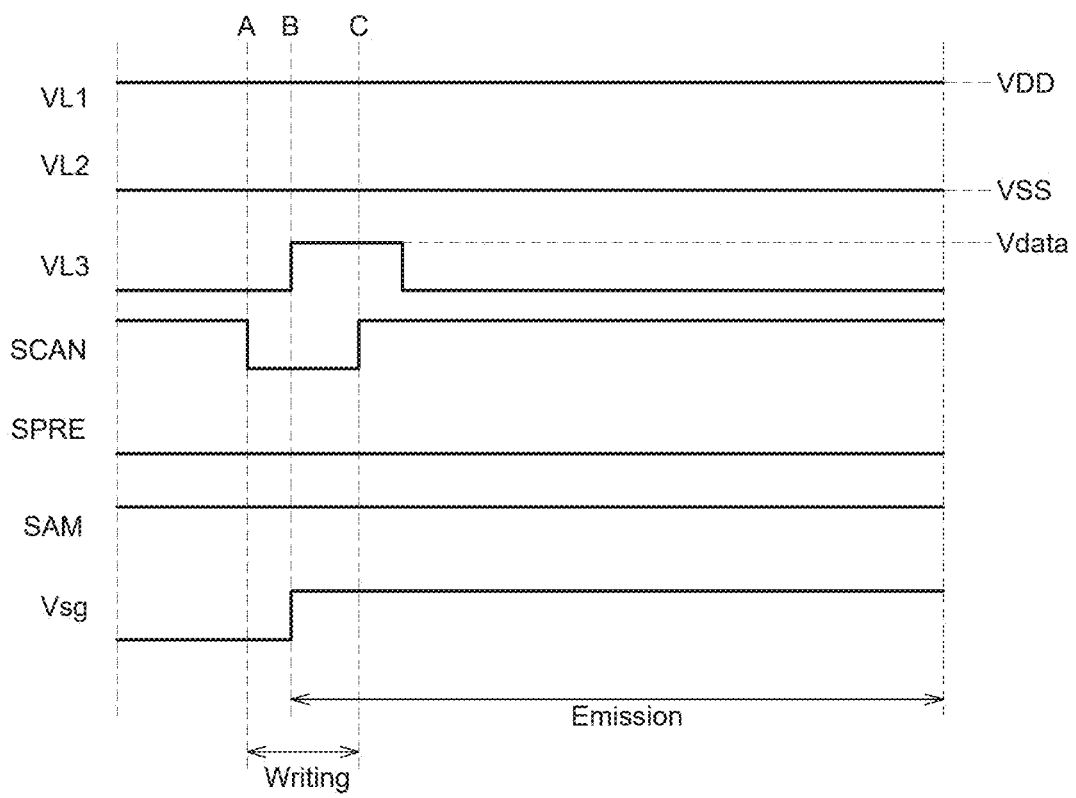

FIGS. 3A and 3B are driving timing diagrams of a sub pixel of a display device according to an exemplary embodiment of the present disclosure. FIG. 4 is a driving timing diagram of a sensing period of a sub pixel of a display device according to an exemplary embodiment of the present disclosure. Specifically, FIGS. 3A and 3B are driving timing diagrams during one frame of a period when the display device 100 displays an image. FIG. 4 is a driving timing diagram during a sensing period of sensing a threshold voltage of the second transistor T2 of the sub pixel SP when the power of the display device 100 is turned off.

First, the plurality of sub pixels SP of the display device 100 according to the exemplary embodiment of the present disclosure may be driven in the order of the data writing period Writing and the emission period Emission. Further, depending on the voltage applied to the first wiring line VL1, the data writing period Writing and the emission period Emission may be separated or partially overlap. For example, referring to FIG. 3A, the high potential power voltage VDD and the turn-off voltage VOFF are applied to the first wiring line VL1 so as not to overlap the data writing period Writing and the emission period Emission. As another example, referring to FIG. 3B, the high potential power voltage is continuously applied to the first wiring line VL1 to simultaneously perform a partial period of the data writing period Writing and the emission period Emission.

An example that the data writing period Writing and the emission period Emission are separately configured will be described first with reference to FIGS. 2 and 3A. A period between a time A and a time D is a data writing period Writing and a period after the time D is an emission period Emission. The data writing period Writing and the emission period Emission may be determined according to a voltage output from the first wiring line VL1. For example, the data writing period Writing is a period when the turn-off voltage VOFF is output from the first wiring line VL1 and the emission period Emission may be a period when the high potential power voltage VDD which is a first power voltage is output from the first wiring line VL1. During the data writing period Writing, a voltage difference between the gate electrode and the source electrode of the second transistor T2 may be set to correspond to the data voltage Vdata and during the emission period Emission, the driving current is supplied to the light emitting diode EL to allow the light emitting diode EL to emit light.

First, during the period between the time A and the time D which is a data writing period Writing, the turn-off voltage VOFF is output to the first wiring line VL1. During the period between the time A and the time D, the light emitting diode EL maintains a turned-off state by the turn-off voltage VOFF of the first wiring line VL1.

Next, during the data writing period Writing, at the time A, a low level of scan signal SCAN is output to the scan line SL. The first transistor T1 and the third transistor T3 may be turned on by the scan signal SCAN output at the time A.

The gate electrode of the second transistor T2 and the second wiring line VL2 may be electrically connected by the first transistor T1 which is turned on at the time A. At this time, during the data writing period Writing and the emission period Emission, a low potential power voltage VSS which is a second power voltage is continuously output to the second wiring line VL2. Accordingly, during a period between the time A and a time C, that is, a period when the scan signal SCAN is maintained at a low level, a voltage of the gate electrode of the second transistor T2, that is, a voltage of the first node N1 may be fixed to the low potential power voltage VSS.

The third wiring line VL3 and the source electrode of the second transistor T2 may be electrically connected by the third transistor T3 which is turned on at the time A. During a period when the third wiring line VL3 and the source electrode of the second transistor T2 are connected, the data voltage Vdata may be output to the third wiring line VL3. For example, during a time B in a period when the scan signal SCAN is a low level, the data voltage Vdata may be output to the third wiring line VL3. Accordingly, from the time B, a voltage of the source electrode of the second transistor T2, that is, a voltage of the second node N2 may be set to the data voltage Vdata.

Even though in FIG. 3A, a period before the emission period Emission is defined as the data writing period Writing, a period when the data voltage Vdata may be written in the sub pixel SP is a period between the time A and the time C when the scan signal SCAN is a low level.

Further, in order to apply the data voltage Vdata to the third wiring line VL3, the first control transistor CT1 of the data driver DD is turned on and the second control transistor CT2 may be turned off. During a period when the display device 100 is driven, that is, the data writing period Writing and the emission period Emission, a low level of first control signal SPRE is output to the first control line so that the first control transistor CT1 is turned on. Further, a high level of second control signal SAM is output to the second control line so that the second control transistor CT2 may be turned off. Accordingly, during the data writing period Writing and the emission period Emission, only the first control transistor CT1 is turned on so that the third wiring line VL3 may be used as a data line.

In summary, during the data writing period Writing between the time A and the time D, a voltage of the gate electrode of the second transistor T2 is set to the low potential power voltage VSS and a voltage of the source electrode of the second transistor T2 may be set to the data voltage Vdata. Accordingly, the source-gate voltage Vsg of the second transistor T2 may be set to a difference voltage of the low potential power voltage VSS and the data voltage Vdata. For example, when the low potential power voltage VSS of 0 V is continuously applied to the gate electrode of the second transistor T2 from the time A and a voltage of 0 V is applied to the source electrode of the second transistor T2 during a period between the time A and the time B, a source-gate voltage Vsg may be 0 V. Further, the data voltage Vdata which is higher than 0 V, for example, a data voltage Vdata of 9 V is applied to the source electrode of the second transistor T2 from the time B. At this time, a source-gate voltage Vsg which is a voltage difference between the gate electrode and the source electrode of the second transistor T2 from the time B may be increased to 9 V. Therefore, as illustrated with the waveform of Vsg of FIG. 3A, it is confirmed that Vsg is increased from the time B when the voltage output from the third wiring line VL3 is increased.

Accordingly, during the data writing period Writing between the time A and the time D, the source-gate voltage Vsg which is a difference voltage between the gate electrode and the source electrode of the second transistor T2, which is a driving transistor, may be set to a difference voltage of the data voltage Vdata and the low potential power voltage VSS. Further, the source-gate voltage Vsg is stored in the capacitor Cst connected to the gate electrode and the source electrode of the second transistor T2 so that the source-gate voltage Vsg may be maintained to be constant for one frame.

Next, at the time C, a high level of scan signal SCAN is output to the scan line SL so that the first transistor T1 and the third transistor T3 may be turned off. The gate electrode and the source electrode of the second transistor T2 may be floated by the turned-off first transistor T1 and third transistor T3. At this time, the current flows from the source electrode to the drain electrode of the second transistor so that a voltage of the source electrode of the second transistor T2 may be reduced. Further, the voltage of the gate electrode of the second transistor T2 is also reduced in the same manner as the source electrode by the capacitor Cst which is configured to maintain the voltage difference between the gate electrode and the source electrode of the second transistor T2. For example, the voltage of the source electrode of the second transistor T2 is reduced until the voltage is equal to the voltage of the second wiring line VL2 connected to the drain electrode of the second transistor T2. The voltage of the gate electrode is also reduced in the same way so as to maintain the source-gate voltage Vsg. For example, in a state when the data voltage Vdata of 9 V is applied to the source electrode of the second transistor T2 and the low potential power voltage VSS of 0 V is applied to the gate electrode so that the source-gate voltage Vsg is set to 9V, when the first transistor T1 and the third transistor T3 are turned off, the current flows from the source electrode to the drain electrode of the second transistor T2. Further, the voltage of the source electrode of the second transistor T2 may be reduced to 0 V which is the same voltage as the voltage of the second wiring line VL2. Further, the voltage of the gate electrode of the second transistor T2 is reduced to be the same as the voltage of the source electrode to maintain the source-gate voltage Vsg of 9 V and may become −9 V. Accordingly, during the data writing period Writing, the turn-off voltage VOFF, the low potential power voltage VSS, and the data voltage Vdata are applied to the sub pixel SP to control the light emitting diode EL so as not to emit light and the source-gate voltage Vsg of the second transistor T2 may be set to a voltage corresponding to the data voltage Vdata.

Next, the high potential power voltage VDD which is a first power voltage is applied to the first wiring line VL1 after the time D, which is an emission period Emission. Accordingly, the high potential power voltage VDD is supplied to the anode of the light emitting diode EL during the emission period Emission after the time D and the driving current may flow from the anode to the cathode side of the light emitting diode EL.

At this time, an intensity of the driving current may be determined based on the source-gate voltage Vsg of the second transistor T2 set during the period between the time A and the time D. Specifically, as the voltage which is output to the first wiring line VL1 is increased from the turn-off voltage VOFF to the high potential power voltage VDD, a voltage of the source electrode and a voltage of the gate electrode of the second transistor T2 may be temporally boosted. A voltage which is applied to the source electrode of the second transistor T2 is increased from the turn-off voltage VOFF to the high potential power voltage VDD and the voltage of the source electrode and the voltage of the gate electrode of the second transistor T2 may be increased together. The voltage of the source electrode and the voltage of the gate electrode of the second transistor T2 may be increased while maintaining the source-gate voltage Vsg of the second transistor T2 by the capacitor Cst to be constant. Therefore, the second transistor T2 is in a turned-on state and the driving current may flow from the first wiring line VL1 to the second transistor T2 and the second wiring line VL2.

For example, when the high potential power voltage VDD of 9 V is applied to the sub pixel SP after the time D, the voltage of the gate electrode of the second transistor T2 is boosted from −9 V to −2 V and the voltage of the source electrode may be boosted from 0 V to 7 V. Accordingly, during the emission period Emission, the driving current flows from the first wiring line VL1 to the second wiring line VL2 and the light emitting diode EL may emit light with a luminance corresponding to the data voltage Vdata of 9 V.

As another example, when the data voltage Vdata of 0 V, that is, a black data voltage Vdata is applied to the sub pixel SP to set the source-gate voltage Vsg of the second transistor T2 to 0 V before the time D. Further, the high potential power voltage VDD of 9 V is applied to the sub pixel SP at the time D, the voltage of the gate electrode of the second transistor T2 is boosted from 0 V to 7 V and the voltage of the source electrode may be boosted from 0 V to 7 V. However, even though the high potential power voltage VDD is supplied to the sub pixel SP and the voltage of the gate electrode and the source electrode of the second transistor T2 is boosted, the source-gate voltage Vsg of the second transistor T2 becomes 0 V. Therefore, the second transistor T2 maintains a turned-off state and the driving current does not flow and a black image may be displayed in the sub pixel SP.

Therefore, the source-gate voltage Vsg of the second transistor T2 maintains the source-gate voltage Vsg set in the data writing period Writing by the high potential power voltage VDD supplied to the sub pixel SP at the time D and the voltage of the gate electrode and the source electrode of the second transistor T2 is totally increased. Accordingly, the high potential power voltage VDD and the low potential power voltage VSS are applied to the sub pixel SP during the emission period Emission to flow a driving current which is proportional to the source-gate voltage Vsg of the second transistor T2 and finally the light emitting diode EL may emit light.

Next, an example that a partial period of the data writing period Writing and the emission period Emission are simultaneously performed will be described with reference to FIGS. 2 and 3B. The high potential power voltage VDD may be consistently output to the first wiring line VL1. Therefore, the light emitting diode EL may begin to emit light immediately after the time B when the data voltage Vdata is applied.

The source-gate voltage Vsg of the second transistor T2 may be set from the time B when the data voltage Vdata is applied to the source electrode of the second transistor T2. Further, the driving current may flow to the light emitting diode EL according to the high potential power voltage VDD supplied to the sub pixel SP and the source-gate voltage Vsg of the second transistor T2 at the time B. Therefore, the emission period Emission may start from the time B when the data voltage Vdata is actually applied in the data writing period Writing between the time A and the time C when the data voltage Vdata is written. Therefore, at least a partial period of the data writing period Writing and the emission period Emission overlap and a longer emission period Emission of the light emitting diode EL is ensured.

Accordingly, in the display device 100 according to the exemplary embodiment of the present disclosure, the data writing period Writing and the emission period Emission of the sub pixel SP may vary depending on the method of applying the high potential power voltage VDD or the turn-off voltage VOFF to the first wiring line VL1. The emission period Emission of the sub pixel SP may be adjusted by adjusting a voltage applied to the first wiring line VL1 and the sub pixel SP may be driven in various manners.

Hereinafter, a process of sensing a threshold voltage of the second transistor T2 in the sensing period of the display device 100 according to the exemplary embodiment of the present disclosure will be described with reference to FIGS. 2 and 4 together.

Figure 4:
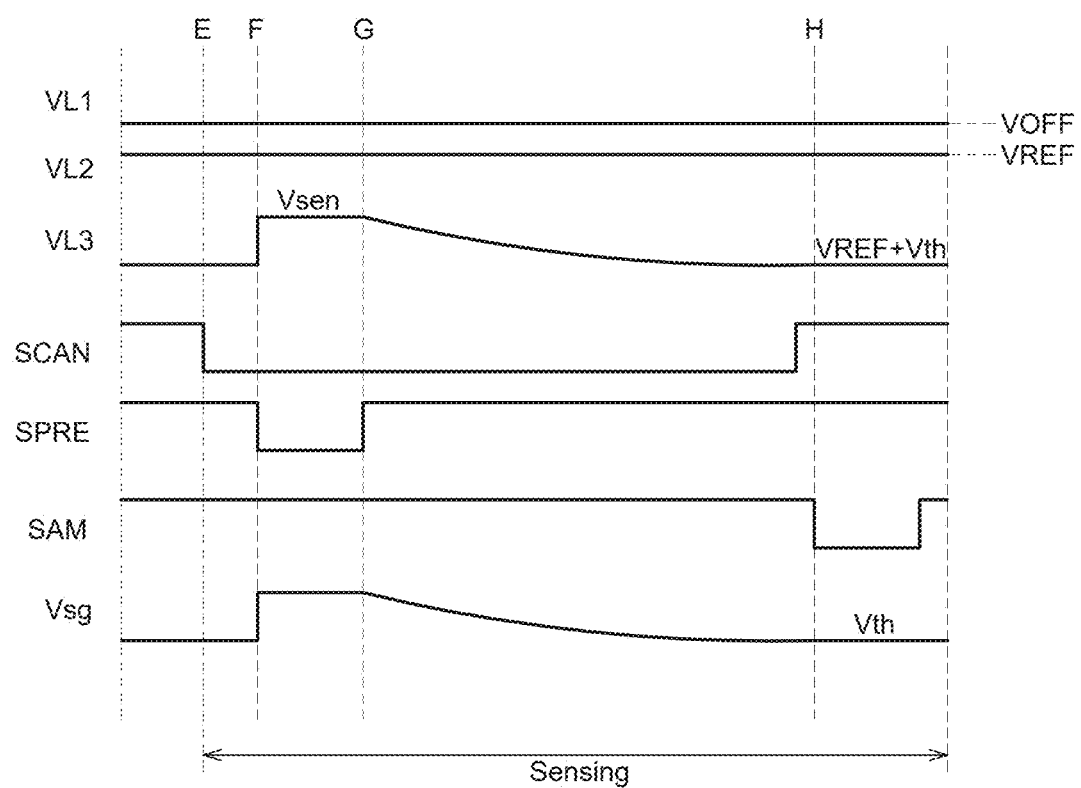
FIG. 4 is a driving timing diagram of a sensing period of a sub pixel of a display device according to an exemplary embodiment of the present disclosure.

Referring to FIGS. 2 and 4, the display device 100 according to the exemplary embodiment of the present disclosure may sense a threshold voltage of the second transistor T2 of the plurality of sub pixels SP by the OFF-RS method of sensing a characteristic deviation between the plurality of sub pixels SP when the power of the display device 100 is turned off. At this time, the sensed threshold voltage deviation may be reflected to the data voltage Vdata to be applied to the sub pixel SP later and the compensated data voltage Vdata is applied to the plurality of sub pixels SP to compensate for the threshold voltage deviation of the plurality of sub pixels SP.

First, during the sensing period, the turn-off voltage VOFF is output to the first wiring line VL1. During the sensing period performed when the display device 100 is off, the light emitting diode EL may maintain a turned-off state by the turn-off voltage VOFF of the first wiring line VL1.

Next, at the time E, a low level of scan signal SCAN is output to the scan line SL. The first transistor T1 and the third transistor T3 may be turned on by the scan signal SCAN output at the time E.

The gate electrode of the second transistor T2 and the second wiring line VL2 may be electrically connected by the first transistor T1 which is turned on at the time E. At this time, during the sensing period, the reference voltage VREF is continuously output to the second wiring line VL2. Accordingly, during a period when the scan signal SCAN is maintained at the low level, the voltage of the gate electrode of the second transistor T2 may be fixed to the reference voltage VREF.

The third wiring line VL3 and the source electrode of the second transistor T2 may be electrically connected by the third transistor T3 which is turned on at the time E. Further, at the time F of a period when the scan signal SCAN is maintained at the low level, the first control transistor CT1 may be turned on. The first control transistor CT1 which is turned on by the first control signal SPRE may transmit the sensing voltage Vsen to the third wiring line VL3. Accordingly, the sensing voltage Vsen may be applied to the source electrode of the second transistor T2 by means of the turned-on first control transistor CT1 and the third transistor T3 and the third wiring line VL3 during the period between the time F and the time G. Accordingly, the voltage of the source electrode of the second transistor T2 may be set to the sensing voltage Vsen from the period between the time F and the time G.

Further, the sensing voltage Vsen and the reference voltage VREF are charged in the source electrode and the gate electrode of the second transistor T2 during the period between the time F and the time G so that the source-gate voltage Vsg of the second transistor T2 may be set to the difference voltage of the sensing voltage Vsen and the reference voltage VREF. For example, when the reference voltage VREF of 4.5 V is applied to the gate electrode of the second transistor T2 and the sensing voltage Vsen of 9 Vis applied to the source electrode of the second transistor T2, the source-gate voltage Vsg of the second transistor T2 may be set to 4.5 V. At this time, the source-gate voltage of the second transistor T2 is higher than the threshold voltage of the second transistor T2 and the second transistor T2 may be in a turned-on state.

Next, a high level of first control signal SPRE is output to the first control line from the time G so that the first control transistor CT1 may be turned off. At this time, the high level of second control signal SAM is also output to the second control line so that the second control transistor CT2 is also turned off. Therefore, from the time G, no signal is applied to the third wiring line VL3 and the source electrode of the second transistor T2 connected to the third wiring line VL3 may be floated.

From the time G, the current flows from the source electrode to the drain electrode of the second transistor T2 and the voltage of the source electrode may be reduced and the current flows until a voltage of the source electrode of the second transistor T2 becomes a sum of the voltage of the gate electrode of the second transistor T2 and the threshold voltage. In the period after the time G, the voltage is not applied to the second node N2 any more so that the current flows from the source electrode to the drain electrode of the second transistor T2 and the voltage of the source electrode may be reduced. At this time, the reference voltage VREF is continuously supplied to the gate electrode of the second transistor T2 so that the voltage of the gate electrode is fixed to the reference voltage VREF.

When the source-gate voltage Vsg of the second transistor T2 is higher than the threshold voltage, the second transistor T2 is turned on so that the current flows. Therefore, when the voltage of the source electrode of the second transistor T2 is reduced so that the source-gate voltage Vsg of the second transistor T2 is equal to or lower than the threshold voltage, the second transistor T2 is turned off so that the current does not flow. Therefore, the current may flow until the voltage of the source electrode of the second transistor T2 is reduced to a voltage corresponding to the sum of the voltage of the gate electrode of the second transistor T2 and the threshold voltage. For example, the current flows from the source electrode to the drain electrode of the second transistor T2 from the time G and after a predetermined period, the voltage of the source electrode of the second transistor T2 may be converged to the sum of the reference voltage VREF and the threshold voltage.

From the time G, the voltage of the source electrode of the second transistor T2 may be stored in the line capacitor Cvl3 through the turned-on third transistor T3 and the third wiring line VL3. For example, after a predetermined time has elapsed from the time G, the voltage of the source electrode of the second transistor T2, that is, a voltage obtained by adding the voltage of the gate electrode of the second transistor T2 and the threshold voltage may be stored in the line capacitor Cvl3.

Next, after the voltage of the source electrode of the second transistor T2 is converged to the sum of the voltage of the gate electrode of the second transistor T2 and the threshold voltage so that the second transistor T2 is turned off, for example, the low level of second control signal SAM is output at the time H so that the second control transistor CT2 may be turned on. Therefore, the third wiring line VL3 and the line capacitor Cvl3 and the analog-digital converter ADC are connected and the analog-digital converter ADC may sense a voltage of the source electrode of the second transistor T2 stored in the line capacitor Cvl3, that is, a voltage of the sum of the voltage of the gate electrode of the second transistor T2 and the threshold voltage. Therefore, the threshold voltage of the second transistor T2 may be detected based on the reference voltage VREF applied to the gate electrode of the second transistor T2 and the voltage of the line capacitor Cvl3 sensed by the analog-digital converter ADC.

Thereafter, when the display device 100 is driven, the data driver DD compensates for the data voltage Vdata in consideration of a threshold voltage deviation of the second driving transistor of the plurality of sub pixels SP detected in the sensing period and applies the compensated data voltage Vdata to the sub pixel SP to minimize or at least reduce the luminance irregularity.

Accordingly, in the display device 100 according to the exemplary embodiment of the present disclosure, the plurality of sub pixels SP are driven and the threshold voltage may be sensed by varying a voltage applied to each of the first wiring line VL1, the second wiring line VL2, and the third wiring line VL3 connected to the plurality of sub pixels SP according to the driving period. For example, during the data writing period Writing, the turn-off voltage VOFF is applied to the first wiring line VL1, the low potential power voltage VSS which is a second power voltage is applied to the second wiring line VL2, and the data voltage Vdata is applied to the third wiring line VL3 to write the data voltage Vdata in the sub pixel SP. During the emission period Emission, the high potential power voltage VDD which is a first power voltage is applied to the first wiring line VL1 and the low potential power voltage VSS which is a second power voltage is applied to the second wiring line VL2 to flow the driving current to the sub pixel SP and allow the light emitting diode EL to emit light. Further, during the sensing period, the turn-off voltage VOFF is applied to the first wiring line VL1, the reference voltage VREF is applied to the second wiring line VL2, and the sensing voltage Vsen is applied to the third wiring line VL3 to sense the threshold voltage of the second transistor T2. Therefore, the first wiring line VL1 may serve as a wiring line which controls the light emitting diode EL to emit light and supplies the high potential power voltage VDD to flow the driving current. The second wiring line VL2 may serve as a wiring line which applies the low potential power voltage VSS and a wiring line which applies the reference voltage VREF. The third wiring line VL3 may serve as a wiring line which applies the data voltage Vdata and a wiring line which applies a sensing voltage Vsen. Accordingly, the first wiring line VL1, the second wiring line VL2, and the third wiring line VL3 apply various voltages to the sub pixel SP instead of various wiring lines of the related art so that the number of the plurality of wiring lines may be reduced. Therefore, the manufacturing cost of the display device 100 is saved by reducing the number of wiring lines and the aperture ratio of the display device 100 may be improved. Further, when the display device 100 is a transparent display device, the number of wiring lines is reduced, which may improve the transmittance of the display device 100.

In the meantime, in the related art, in order to sense the threshold voltage of the driving transistor of each of the plurality of sub pixels SP, one reference line is connected to n sub pixels SP and threshold voltages of n sub pixels are sequentially sensed. For example, the plurality of sub pixels SP which forms one pixel is connected to one reference line and the threshold voltages of the driving transistors of the plurality of sub pixels SP are sequentially sensed. Therefore, in order to sequentially sense the threshold voltages of the driving transistors of the plurality of sub pixels SP, more sensing time is necessary.

In contrast, in the display device 100 according to the exemplary embodiment of the present disclosure, a third wiring line VL3 is connected to each of the plurality of sub pixels SP to sense the threshold voltage so that the threshold voltages of the second transistors T2 of the plurality of sub pixels SP may be simultaneously sensed. N sub pixels SP do not share one third wiring line VL3, but the third wiring line VL3 is connected to each of the plurality of sub pixels SP to simultaneously sense the threshold voltages of the second transistors T2 of the plurality of sub pixels SP. Accordingly, the threshold voltages of the second transistors T2 of the plurality of sub pixels SP are simultaneously sensed to save the total sensing time and the threshold voltage of the second transistor T2 may be quickly sensed.

Figure 5:
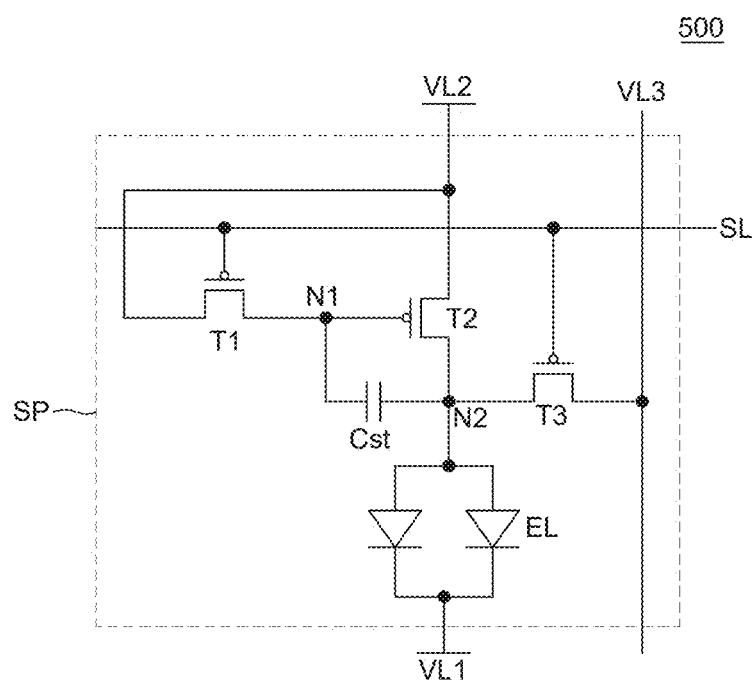
FIG. 5 is a circuit diagram of a sub pixel of a display device according to another exemplary embodiment of the present disclosure.
Figure 6:
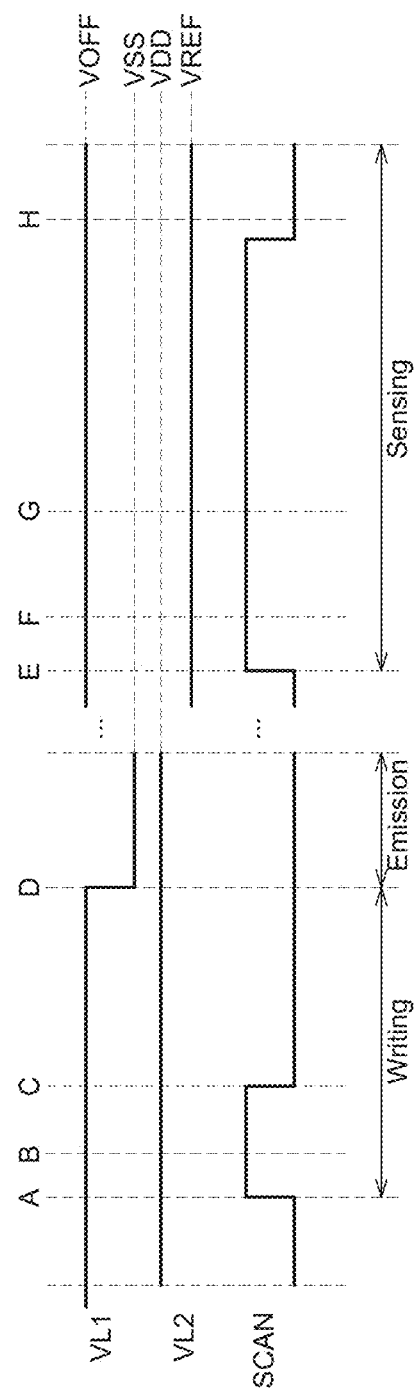
FIG. 6 is a driving timing diagram of a sub pixel of a display device according to another exemplary embodiment of the present disclosure.

FIG. 5 is a circuit diagram of a sub pixel of a display device according to another exemplary embodiment of the present disclosure. FIG. 6 is a driving timing diagram of a sub pixel of a display device according to another exemplary embodiment of the present disclosure. For the convenience of description, only waveforms of a first wiring line VL1, a second wiring line VL2, and a scan line SL are illustrated in FIG. 6. A display device 500 of FIGS. 5 and 6 is substantially the same as the display device 100 of FIGS. 1 to 4 except that a plurality of transistors of the sub pixel SP are N-type transistors and signals applied to the plurality of wiring lines are partially different. Therefore, a redundant description will be omitted.

Referring to FIG. 5, the sub pixel SP includes a plurality of transistors and the plurality of transistors may be N-type transistors. In the N-type transistor, carriers are electrons so that electrons flow from the source electrode to the drain electrode and currents flow from the drain electrode to the source electrode. Further, when a high-level signal is applied to the gate electrode, the N-type transistor may be turned on.

First, the first transistor T1 is a transistor for electrically connecting the second wiring line VL2 to a gate electrode of the second transistor T2. The first transistor T1 is a transistor for controlling a voltage of a gate electrode of the second transistor T2. The gate electrode of the first transistor T1 is connected to the scan line SL, the drain electrode is connected to the second wiring line VL2, and the source electrode is connected to the first node N1 and the gate electrode of the second transistor T2. The first transistor T1 is turned on by a high level of scan signal SCAN from the scan line SL to electrically connect the second wiring line VL2 and the gate electrode of the second transistor T2.

The second transistor T2 is a transistor which controls a driving current to be supplied to the light emitting diode EL. The gate electrode of the second transistor T2 is connected to the first node N1, the source electrode is connected to the second node N2, and the drain electrode is connected to the second wiring line VL2. An intensity of a driving current which flows to the light emitting diode EL may be determined based on a gate-source voltage Vgs of the second transistor T2. Accordingly, the second transistor T2 may be referred to as a driving transistor.

The third transistor T3 is a transistor for electrically connecting the third wiring line VL3 to a source electrode of the second transistor T2. The third transistor T3 is a transistor which transmits a data voltage Vdata to the second transistor T2 or senses a threshold voltage of the second transistor T2. The gate electrode of the third transistor T3 is connected to the scan line SL, the source electrode is connected to the second node N2, and the drain electrode is connected to the third wiring line VL3. The third transistor T3 is turned on by a high level of scan signal SCAN from the scan line SL to electrically connect the third wiring line VL3 and the source electrode of the second transistor T2.

One or more light emitting diodes EL are disposed in the sub pixel SP. The anode of the light emitting diode EL is connected to the second node N2 and the source electrode of the second transistor T2 and the cathode is connected to the first wiring line VL1. Accordingly, the light emitting diode EL may emit light based on a driving current which flows from the second wiring line VL2 to the second transistor T2.

The capacitor Cst maintains a potential difference between the gate electrode and the source electrode of the second transistor T2 while the light emitting diode EL emits light, so that a constant driving current may be supplied to the light emitting diode EL. The capacitor Cst may maintain the gate-source voltage Vgs constantly while the light emitting diode EL emits light. The capacitor Cst includes a plurality of capacitor Cst electrodes and some capacitor Cst electrode is connected to the first node N1 and the gate electrode of the second transistor T2 and the other capacitor Cst electrode is connected to the second node N2 and the source electrode of the second transistor T2.

The first wiring line VL1 is a wiring line for supplying a first power voltage or a turn-off voltage VOFF to the sub pixel SP. Accordingly, during a period when the light emitting diode EL of the sub pixel SP emits light, the first power voltage is output to the first wiring line VL1 and during a period when the light emitting diode EL does not emit light, the turn-off voltage VOFF may be output to the first wiring line VL1. The driving current may flow from the second wiring line VL2 to the first wiring line VL1 while supplying the first power voltage. Therefore, the first power voltage of the first wiring line VL1 is a relatively low voltage so that the driving current flows from the second wiring line VL2 to the first wiring line VL1 and for example, the first power voltage may be a low potential power voltage VSS.

Further, the driving current may not flow in the light emitting diode EL while supplying the turn-off voltage VOFF to the first wiring line VL1. The turn-off voltage VOFF may be configured by a relatively high voltage, for example, a voltage equal to the high potential power voltage VDD so as not to flow the current from the second wiring line VL2 to the first wiring line VL1. For example, the low potential power voltage VSS which is the first power voltage is 0 V and the turn-off voltage VOFF is higher than 0 V, that is, 9 V. Accordingly, the first wiring line VL1 may serve as a low potential power line.

The second wiring line VL2 is a wiring line for supplying a second power voltage or a reference voltage VREF to the sub pixel SP. The second power voltage is output to the second wiring line VL2 while the image is displayed and the reference voltage VREF may be output to the second wiring line VL2 during a period when a characteristic of each of the plurality of sub pixels SP is sensed. When the display device 500 displays an image, that is, the sub pixel SP is driven, the second power voltage may be applied to the second wiring line VL2. At this time, the second power voltage of the second wiring line VL2 is a relatively high voltage so that the driving current flows from the second wiring line VL2 to the first wiring line VL1 and for example, the second power voltage may be a high potential power voltage VDD. Further, when the screen of the display device 500 is turned off and the threshold voltage of the second transistor T2 of the plurality of sub pixels SP is sensed, the reference voltage VREF may be applied to the second wiring line VL2. Accordingly, the second wiring line VL2 may serve as a high potential power line and a reference line.

The third wiring line VL3 is a wiring line for supplying the data voltage Vdata or the sensing voltage Vsen to the sub pixel SP or sensing a voltage change of the source electrode of the second transistor T2. The data voltage Vdata is output to the third wiring line VL3 while driving the sub pixel SP. Further, during a period when characteristics of the plurality of sub pixels SP are sensed, the sensing voltage Vsen is output to the third wiring line VL3 or a voltage change of the source electrode of the second transistor T2 may be sensed using the third wiring line VL3. When the display device 500 displays an image, the data voltage Vdata may be applied to the third wiring line VL3. During the sensing period which is performed when the screen of the display device 500 is turned off, the sensing voltage Vsen is applied to the third wiring line VL3 or the voltage change of the source electrode of the second transistor T2 may be sensed using the third wiring line VL3. As a result, the third wiring line VL3 may serve as a data line and a sensing line.

Referring to FIGS. 5 and 6 together, during the period between the time A and the time D which is the data writing period Writing, the turn-off voltage VOFF is applied to the first wiring line VL1 and the high potential power voltage VDD which is a second power voltage may be applied to the second wiring line VL2. The N-type transistor is turned on by a high level of scan signal SCAN so that during the period between the time A and the time C, a high level of scan signal SCAN may be output to the scan line SL. Therefore, during the period between the time A and the time C, the first transistor T1 and the third transistor T3 may be turned on by the high level of scan signal SCAN and the turned-on third transistor T3 may transmit the data voltage Vdata from the third wiring line VL3 to the second node N2. Further, during the period when the data voltage Vdata is written, the turn-off voltage VOFF is applied to the first wiring line VL1 so that the light emitting diode EL may maintain a turned-off state.

Further, the low potential power voltage VSS may be applied to the first wiring line VL1 from the period after the time D which is the emission period Emission. Before the time D, the turn-off voltage VOFF of the first wiring line VL1 and the high potential power voltage VDD of the second wiring line VL2 are substantially equal to each other so that the driving current may not flow. However, after the time D, the driving current may flow from the second wiring line VL2 to which the high potential power voltage VDD is applied to the first wiring line VL1 to which the low potential power voltage VSS is applied. At this time, the intensity of the driving current may vary by the gate-source voltage Vgs of the second transistor T2. Accordingly, during the emission period Emission, the low potential power voltage VSS is applied to the first wiring line VL1 so that the driving current may flow from the second wiring line VL2 to the first wiring line VL1 and the light emitting diode EL may emit light.

Next, a period after the time E is a sensing period so that during the sensing period, the turn-off voltage VOFF is applied to the first wiring line VL1 and the reference voltage VREF may be applied to the second wiring line VL2. The light emitting diode EL may maintain the turned-off state by the turn-off voltage VOFF of the first wiring line VL1. Further, the reference voltage VREF of the second wiring line VL2 may be transmitted to the gate electrode of the second transistor T2 and the first node N1 through the turned-on first transistor T1. During the sensing period, the voltage of the gate electrode of the second transistor T2 may be fixed to the reference voltage VREF. Further, in a state in which the voltage of the gate electrode of the second transistor T2 is fixed to the reference voltage VREF, the current flows from the drain electrode to the source electrode of the second transistor T2. A voltage of the source electrode of the second transistor T2 may be converged to the sum of the voltage of the gate electrode of the second transistor T2 and the threshold voltage. Therefore, the threshold voltage of the second transistor T2 may be detected based on the voltage of the source electrode of the second transistor T2 and the reference voltage VREF applied to the gate electrode of the second transistor T2.

In the meantime, in FIG. 6, it is described that the turn-off voltage VOFF is applied to the first wiring line VL1 during the data writing period Writing, the low potential power voltage VSS is applied to the first wiring line VL1 during the emission period Emission so that the data writing period Writing and the emission period Emission are separately configured, but it is not limited thereto. For example, like the driving method of FIG. 3B, during the period when the display device 500 displays an image, when the low potential power voltage VSS is continuously applied to the first wiring line VL1 to apply the data voltage Vdata, the emission period Emission starts, but it is not limited thereto.

Accordingly, in the display device 500 according to another exemplary embodiment of the present disclosure, the transistor of the sub pixel SP may be configured by the N-type transistor. The first transistor T1, the second transistor T2, and the third transistor T3 are formed by N-type transistors which are turned on by a high-level signal to drive the light emitting diode EL. In this case, the light emitting diode EL may be configured with a common cathode structure in which the cathode is commonly connected to the first power line. Further, in order to flow the driving current from the anode to the cathode side of the light emitting diode EL, the high potential power voltage VDD is applied to the second power line located at the anode side of the light emitting diode EL and the low potential power voltage VSS is applied to the first power line connected to the cathode side of the light emitting diode EL. Further, the turn-off voltage VOFF which is applied to the first power line is configured to a high level of voltage, for example, configured to be equal to or higher than the voltage of the second wiring line VL2 so that the light emitting diode EL does not emit light during the data writing period Writing and the sensing period. Accordingly, in the display device 500 according to another exemplary embodiment of the present disclosure, the plurality of transistors of the sub pixel SP is configured to be N-type and a level of a voltage applied to the first wiring line VL1 and the second wiring line VL2 is adjusted to drive the sub pixel SP.

The exemplary embodiments of the present disclosure can also be described as follows:

According to an aspect of the present disclosure, a display device includes a display panel which includes a plurality of sub pixels, a first wiring line which transmits a first power voltage or a turn-off voltage to each of the plurality of sub pixels, a second wiring line which transmits a second power voltage or a reference voltage to each of the plurality of sub pixels, a third wiring line which transmits a data voltage or a sensing voltage to each of the plurality of sub pixels, a plurality of light emitting diodes which is disposed in each of the plurality of sub pixels and is connected to the first wiring line, a first transistor which is disposed in each of the plurality of sub pixels and is connected to the second wiring line, a second transistor which is disposed in each of the plurality of sub pixels and is connected to the second wiring line, and a third transistor which is disposed in each of the plurality of sub pixels and is connected to the third wiring line. The plurality of light emitting diodes includes a main light emitting diode and a redundancy light emitting diode.

The plurality of light emitting diodes may be connected between the first wiring line and a second node, the first transistor may be connected between the second wiring line and a first node, the second transistor may be connected between the second node and the second wiring line, the third transistor may be connected between the third wiring line and the second node, and each of the plurality of sub pixels may further includes a capacitor connected between the first node and the second node.

When the first transistor is turned on, the first transistor may be configured to electrically connect a gate electrode of the second transistor and the second wiring line.

When the second transistor is turned on, the second transistor may be configured to control a driving current which flows from the second node to the second wiring line.

When the third transistor is turned on, the third transistor may be configured to electrically connect a source electrode of the second transistor and the third wiring line.

The first transistor, the second transistor, and the third transistor may be P-type transistors and anodes of the plurality of light emitting diodes may be connected to the first wiring line.

The first power voltage of the first wiring line may be a high potential power voltage and the second power voltage of the second wiring line may be a low potential power voltage.

The first transistor, the second transistor, and the third transistor may be N-type transistors and cathodes of the plurality of light emitting diodes may be connected to the first wiring line.

The first power voltage of the first wiring line may be a low potential power voltage and the second power voltage of the second wiring line may be a high potential power voltage.

The display device may further include a data driver connected to the third wiring line, and the data driver may include an analog-digital converter, a first control transistor which is configured to transmit the data voltage and the sensing voltage to the third wiring line, a second control transistor which is connected between the analog-digital converter and the third wiring line, and a line capacitor connected to the third wiring line.

Each of the plurality of sub pixels may be driven in the order of a data writing period and an emission period, and during the data writing period, the first wiring line may be configured to transmit the turn-off voltage to each of the plurality of sub pixels, the second wiring line may be configured to transmit the second power voltage to each of the plurality of sub pixels, and the third wiring line may be configured to transmit the data voltage to each of the plurality of sub pixels.

During the emission period, the first wiring line may be configured to transmit the first power voltage to each of the plurality of sub pixels and the second wiring line may be configured to transmit the second power voltage to each of the plurality of sub pixels.

A sensing period when a threshold voltage of the second transistor of each of the plurality of sub pixels is sensed when the power of the display device is turned off may be further provided and during the sensing period, the first wiring line may be configured to transmit the turn-off voltage to each of the plurality of sub pixels and the second wiring line may be configured to transmit the reference voltage to each of the plurality of sub pixels.

During a partial period of the sensing period, the third wiring line may be configured to transmit the sensing voltage to each of the plurality of sub pixels.

During the data writing period and the emission period, the first control transistor may be turned on and the second control transistor may be turned off, during a partial period of the sensing period, the first control transistor may be turned on and the second control transistor may be turned off, and during a remaining period of the sensing period, the first control transistor may be turned off and the second control transistor may be turned on.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

What is claimed is:

1. A display device, comprising:
    a display panel including a plurality of sub pixels;
    a first wiring line which transmits a first power voltage or a turn-off voltage to each of the plurality of sub pixels;
    a second wiring line which transmits a second power voltage or a reference voltage to each of the plurality of sub pixels;
    a third wiring line which transmits a data voltage or a sensing voltage to each of the plurality of sub pixels;
    a plurality of light emitting diodes which are disposed in each of the plurality of sub pixels, the plurality of light emitting diodes directly connected to the first wiring line;
    a first transistor in each of the plurality of sub pixels, the first transistor directly connected to the second wiring line;
    a second transistor in each of the plurality of sub pixels, the second transistor connected to the second wiring line; and
    a third transistor in each of the plurality of sub pixels, the third transistor connected to the third wiring line,
    wherein the plurality of light emitting diodes include a main light emitting diode and a redundancy light emitting diode.

2. The display device according to claim 1, wherein the plurality of light emitting diodes are connected to the first wiring line and a second node, the first transistor is connected to the second wiring line and a first node, the second transistor is connected to the second node and the second wiring line, the third transistor is connected to the third wiring line and the second node, and each of the plurality of sub pixels further includes a capacitor connected to the first node and the second node.

3. The display device according to claim 2, wherein when the first transistor is turned on, the first transistor electrically connects a gate electrode of the second transistor and the second wiring line.

4. The display device according to claim 2, wherein when the second transistor is turned on, the second transistor controls a driving current which flows from the second node to the second wiring line.

5. The display device according to claim 2, wherein when the third transistor is turned on, the third transistor electrically connects a source electrode of the second transistor and the third wiring line.

6. The display device according to claim 2, wherein the first transistor, the second transistor, and the third transistor are P-type transistors and anodes of the plurality of light emitting diodes are connected to the first wiring line.

7. The display device according to claim 6, wherein the first power voltage of the first wiring line is a high potential power voltage and the second power voltage of the second wiring line is a low potential power voltage.

8. The display device according to claim 2, wherein the first transistor, the second transistor, and the third transistor are N-type transistors and cathodes of the plurality of light emitting diodes are connected to the first wiring line.

9. The display device according to claim 8, wherein the first power voltage of the first wiring line is a low potential power voltage and the second power voltage of the second wiring line is a high potential power voltage.

10. The display device according to claim 2, further comprising:
    a data driver connected to the third wiring line,
    wherein the data driver includes:
        an analog-digital converter;
        a first control transistor which is configured to transmit the data voltage and the sensing voltage to the third wiring line;
        a second control transistor which is connected to the analog-digital converter and the third wiring line; and
        a line capacitor connected to the third wiring line.

11. The display device according to claim 10, wherein each of the plurality of sub pixels is driven in an order of a data writing period and an emission period, and during the data writing period, the first wiring line transmits the turn-off voltage to each of the plurality of sub pixels, the second wiring line transmits the second power voltage to each of the plurality of sub pixels, and the third wiring line transmits the data voltage to each of the plurality of sub pixels.

12. The display device according to claim 11, wherein during the emission period, the first wiring line transmits the first power voltage to each of the plurality of sub pixels and the second wiring line transmits the second power voltage to each of the plurality of sub pixels.

13. The display device according to claim 11, wherein a sensing period when a threshold voltage of the second transistor of each of the plurality of sub pixels is sensed when a power of the display device is turned off is further provided and during the sensing period, the first wiring line transmits the turn-off voltage to each of the plurality of sub pixels and the second wiring line transmits the reference voltage to each of the plurality of sub pixels.

14. The display device according to claim 13, wherein during a partial period of the sensing period, the third wiring line transmits the sensing voltage to each of the plurality of sub pixels.

15. The display device according to claim 14, wherein during the data writing period and the emission period, the first control transistor is turned on and the second control transistor is turned off, during a partial period of the sensing period, the first control transistor is turned on and the second control transistor is turned off, and during a remaining period of the sensing period, the first control transistor is turned off and the second control transistor is turned on.

* * * * *